(12) United States Patent
Schrum, Jr.

(10) Patent No.: US 9,529,944 B2
(45) Date of Patent: Dec. 27, 2016

(54) CORRIDOR MODELING SYSTEM, APPARATUS, AND METHOD

(71) Applicant: Paul T. Schrum, Jr., Raleigh, NC (US)

(72) Inventor: Paul T. Schrum, Jr., Raleigh, NC (US)

( * ) Notice: Subject to any disclaimer, the term of this patent is extended or adjusted under 35 U.S.C. 154(b) by 446 days.

(21) Appl. No.: 14/176,396

(22) Filed: Feb. 10, 2014

(65) Prior Publication Data

US 2014/0229142 A1 Aug. 14, 2014

Related U.S. Application Data

(60) Provisional application No. 61/763,566, filed on Feb. 12, 2013.

(51) Int. Cl.
*G06F 17/50* (2006.01)

(52) U.S. Cl.
CPC .............................. *G06F 17/5004* (2013.01)

(58) Field of Classification Search
USPC ....... 703/1, 2; 702/5; 382/100, 228; 104/281
See application file for complete search history.

(56) References Cited

U.S. PATENT DOCUMENTS

| | | | | |
|---|---|---|---|---|
| 7,937,220 B2 * | 5/2011 | Herman | ................. | G01V 11/00 367/73 |
| 2010/0312528 A1 * | 12/2010 | Herman | ................. | G01V 11/00 703/1 |
| 2011/0282578 A1 * | 11/2011 | Miksa | ............... | G06F 17/30241 701/532 |
| 2012/0123969 A1 * | 5/2012 | Messmer | ........... | G06Q 30/0283 705/400 |
| 2013/0027385 A1 * | 1/2013 | Lorenz | .................... | G06T 17/10 345/419 |
| 2013/0223751 A1 * | 8/2013 | Fan | ....................... | G06K 9/4609 382/228 |
| 2013/0327244 A1 * | 12/2013 | Robbert | ................. | B61B 13/08 104/281 |

* cited by examiner

*Primary Examiner* — Thai Phan
(74) *Attorney, Agent, or Firm* — Coats & Bennett, PLLC

(57) ABSTRACT

A corridor modelling system models a corridor to be constructed along an existing terrain. The system obtains an electronic representation of the existing terrain, an electronic representation of a typical cross-section of the corridor, and an electronic representation of a 3D baseline of the corridor that aligns the typical cross-section relative to the existing terrain. The system also generates a digital surface model of the corridor based on the electronic representations. The system does so by extruding the typical cross-section along the 3D baseline and fundamentally modeling continuous surfaces of the corridor resulting from the extrusion as a collection of non-planar parametrically defined surfaces, rather than as a group of discrete facets formed from a triangulated irregular network.

34 Claims, 2 Drawing Sheets

Cross Section View of a Ribbon with a variable cross slope.

Cross Section of a Ray extending until it intersects the existing ground.

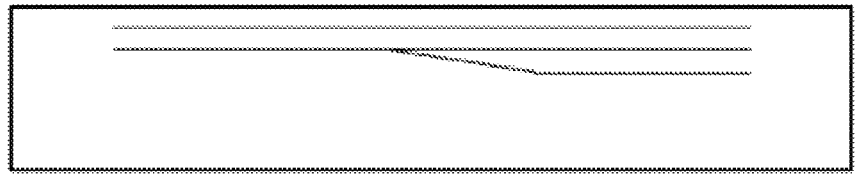
Figure 1: Top View of two Ribbons in which the bottom one (right one) varies in width. This could represent a right turn lane
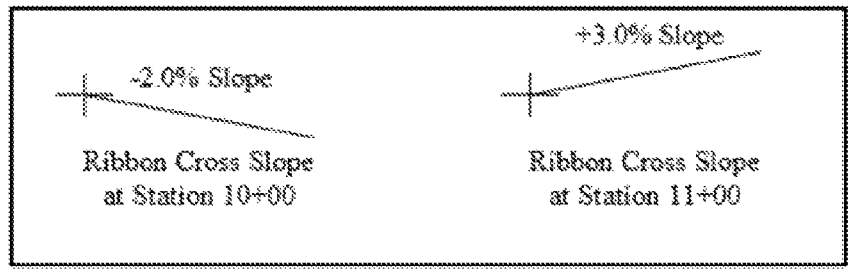
Figure 2: Cross Section View of a Ribbon with a variable cross slope.
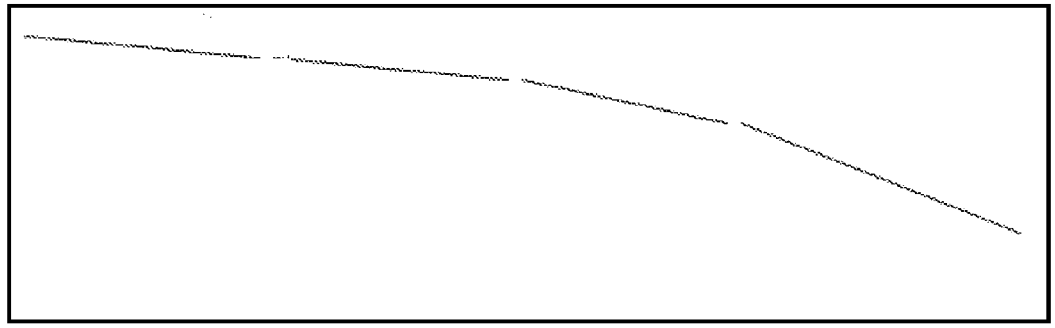
Figure 3: A collection of Ribbons forming the right half of a roadway model in Cross Section View.

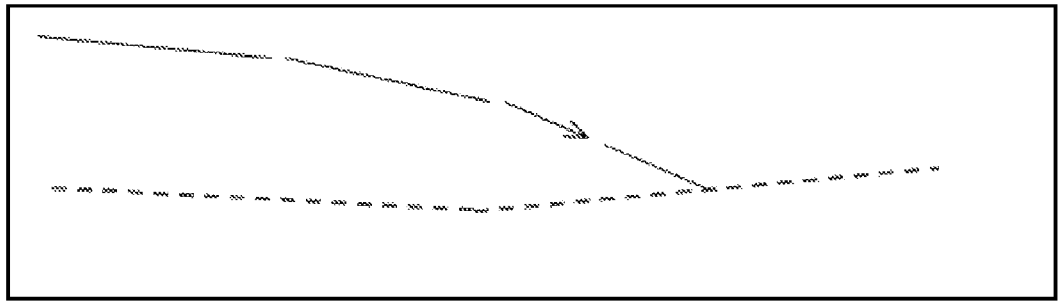
Figure 4: Cross Section of a Ray extending until it intersects the existing ground.
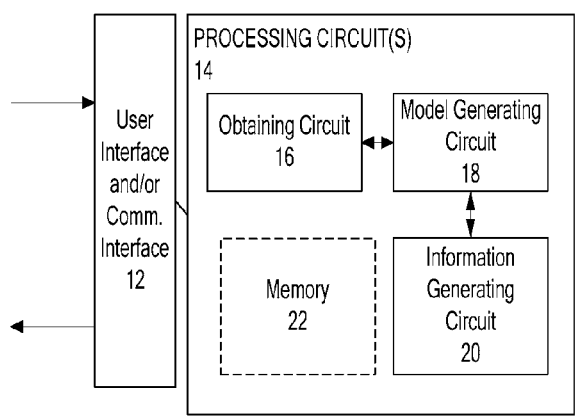
Figure 5

CORRIDOR MODELING SYSTEM, APPARATUS, AND METHOD

RELATED APPLICATIONS

The present application claims the benefit of U.S. Provisional Application 61/763,566, which was filed on Feb. 12, 2013 and is incorporated by reference herein in its entirety.

BACKGROUND

Roads, railroads, runways and taxiways, open channels, including restored streams, culverts, tunnels, and underground utilities are all generally referred to as "corridors." Although roadways are often discussed herein, any discussion related to roadways applies equally to any other type of corridor. Indeed, these corridors are controlled by Horizontal Alignments and Vertical Alignments. Horizontal Alignments serve as curvilinear auxiliary coordinate systems and consist of line segments, circular arcs, and portions of Euler Spirals. These elements are chained together in the Coordinate Geometry Database (also known as the Cogo Database) to make up the Horizontal Alignment (HA). The resulting HA serves as the axis about which all roadway or corridor elements are located in the Horizontal Plane.

When a Vertical Alignment, also known as a Profile or Grade, is associated with a Horizontal Alignment, this combination defines a three-dimensional reference curve about which all other aspects of a corridor are established. Storing, manipulating, and referencing these alignments is an essential prerequisite to developing a roadway model.

However, a Horizontal and Vertical Alignment combination is not sufficient to define all aspects of a proposed roadway. Widths and cross slopes of the roadway surface, shoulders, curbing, ditches, and side slopes are also inherent to the model. Historically, these components have been modeled via cross sections, which are slices of the proposed roadway taken every fifty feet or so. They may be considered equivalent to a variable-orientation Front View, usually oriented at a 90 degree skew to the Horizontal Alignment. In other words, the View Z axis is constrained to lie in the World XY plane and is parallel to the instantaneous tangent of the Horizontal Alignment.

Known approaches have departed from requiring the user to interact with the roadway model via cross sections because they are fixed at static locations, thus limiting flexibility in the design process. Generating cross sections at a density higher than fifty feet would provide more accuracy, but the labor time involved is generally considered inefficient. Despite this trend, proposed cross section plan sheets are still a primary deliverable requirement for most agencies and probably always will be.

Deliverable outputs of a corridor model include alignment data for use in construction survey, quantity computations, paper or electronic plan sets, machine control data, and visualization and presentation, each of which is addressed below.

When a construction project is undertaken, the designer delivers the alignment data to the surveyor who then stakes essential construction control points of the alignment data for others to build by. Usually the output of the Cogo database to some industry standard interchange format is adequate for this alignment data to be delivered.

When a project is bid on by interested contractors, they generate their construction cost bid based on the projected quantities of various pay items. These quantities are computed by the design engineer or an estimating engineer. Approximately 90% of all quantities are computed directly from the design plans. When a project is complete, final quantities are the basis of payment to the builder (or contractor). If final quantities vary too much from estimated quantities, the contractor has grounds to require renegotiation of the unit price of the quantity in variance.

Some of these quantity calculations are simple (such as area of clearing and grubbing), but some are much more complex requiring many hours of computation and input from other quantities. An example of a complex computation is tons of Asphalt Cement for adding to the asphalt plant mix. Volumes of pavement must be computed precisely. Different pavement courses have different mix recipes. Once volumes are known, they are converted to tons per course, which then are used to compute Asphalt Cement, but based on differing rates for different pavement courses.

A well-planned quantity computing application that is closely integrated with the roadway model would be attractive to potential customers if it can save them time in computation and summarizing while leaving a human-readable computation record for project design documentation.

We still build roads by looking at drawings on pieces of paper. Although electronic automation will continue to grow in importance, we will always need plots. Paper and electronic plansets are essential for the engineer to deliver his or her final product to the client.

Much construction activity has become computer controlled with the construction machine driver taking control of the machine only occasionally. The machine control data that is utilized by these packages has become a part of final project delivery which may no longer be overlooked. Fortunately the format is in a well-defined XML protocol. The software simply exports the roadway model which has been developed by the design engineer to the XML file.

Not all consumers of the engineers' work product know how to read roadway plans. For this reason, a small but significant portion of the work of engineers and consultants is in the generation of presentations of the project which are more easily understood by the public. CAD packages must enable accurate and user-friendly development of presentation files directly from the survey data and the proposed roadway model.

The current leaders in the roadway design software market are all moving to a template-based approach with heavy reliance on abstract concepts which are oriented towards a software developer's view of the world and not an engineer's. This leads to non-intuitive user interfaces and cumbersome work flows resulting in models which are still represented by triangulated (irregular) point networks (TINs). Reducing the design surface to a TIN eliminates the original designer's intentions and decisions, and is not amenable to translating back to the design model, all of which are undesirable.

SUMMARY

Embodiments herein include a method performed by a corridor modeling system implemented with one or more processing circuits for modeling a corridor to be constructed along an existing terrain or through or over an existing or proposed surface. The method comprises obtaining at the system an electronic representation of the existing terrain, obtaining at the system an electronic representation of a typical cross-section of the corridor, and obtaining at the system an electronic representation of a 3D baseline of the corridor that aligns the typical cross-section relative to the existing terrain. The method further includes generating at the system a digital surface model of the corridor based on the electronic representations, by extruding the typical cross-section along the 3D baseline and fundamentally modeling continuous surfaces of the corridor resulting from the extrusion as a collection of non-planar parametrically defined surfaces, rather than as a group of discrete facets formed from a triangulated irregular network. The method then further includes generating, based on evaluating the digital surface model, electronic information that facilitates construction of the corridor.

One type of non-planar parametrically defined surface as used above is a surface defined parametrically (e.g., using parametric equations) with a continuous profile of a variable width of the surface and a continuous profile of a variable cross-slope of the surface. A continuous profile of a variable width (also referred to as a width profile) describes the variation of the surface's width along the 3D baseline, in a continuous manner rather than with point samples (these point samples would then constitute a TIN surface). Analogously, a continuous profile of a variable cross-slope (also referred to as a cross slope profile) describes the variation of the surface's cross-slope along the 3D baseline, in a continuous manner rather than with point samples. The width profile and cross slope profile effectively define where this type of non-planar parametrically defined surface begins and ends, both in the offset dimension (left/right) and in the station dimension (forward/backward).

In one or more embodiments, this type of non-planar parametrically defined surface is referred to as a "civil engineering ribbon" or simply "ribbon". In some embodiments, a civil engineering ribbon is a surface defined by emanating from a given elevation at a given direction determined from the normal of the Horizontal Alignment at a determinant cross slope which is stored in a Cross Slope Profile and extends for a determinant total width which is stored in a Width Profile.

Another type of non-planar parametrically defined surface as used above is a surface defined parametrically (e.g., using parametric equations) with a continuous profile of a variable cross-slope of the surface and with the intersection of the surface with another surface. That is, rather than the outside edge or width of the surface being defined by a width profile, the outside edge or width of the surface is defined by where the surface would intersect with another surface.

In one or more embodiments, this type of non-planar parametrically defined surface is referred to as a "ray sheet". A ray sheet is constituted by a continuous extrusion of rays in which the start point for each ray is extruded along a three dimensional reference curve and the ray at each point extends perpendicularly from the three dimensional reference curve in horizontal direction (that is, in the x-y plane projection), and at a specific cross slope to determine change of elevation. A ray sheet extends for a total width determined by intersection with another surface, often that other surface being a Triangulated Irregular Network. That is, rather than the outside edge of the surface being defined by means of a width profile as in the case of a ribbon, the outside edge of the surface (ray sheet) is defined by means of the intersection with another surface. This other surface may be a TIN (e.g., representing the existing ground), a ribbon (e.g., of a different PGL Grouping, as described below), or another ray sheet (e.g., of a different PGL Grouping, as described below). A ray sheet ties the proposed corridor to existing ground for example. A ray sheet can be described as having any finite magnitude so as to be able to intersect another surface (e.g., resolve to another surface), no matter how far away that surface is. In at least some embodiments, a ray sheet is defined to intersect another surface in accordance with a prioritized list of candidate/potentially intersecting surfaces (e.g., existing ground is least prioritized, so that the ray sheet will intersect the highest priority surface). When multiple surfaces are available to resolve the ray sheet to, the end user may indicate which surface carries what priority for resolution. This prioritization may change over station ranges. Resolution Priority is used to determine which surface the ray sheet resolves to when the given geometry allows for multiple resolutions. If a given surface of higher priority is resolvable in a given geometric configuration, the ray sheet resolves to that surface. When a surface of a higher priority can not be resolved to due to the given geometry, the ray sheet resolves to the surface with the next highest priority. When a ray sheet is resolved, this means that for every station along the horizontal alignment, the line segment from the start point to the end point is defined.

In one or more embodiments, yet another type of non-planar parametrically defined surface is referred to as a "hinge sheet". A hinge sheet is somewhat similar to a ray sheet, except that its width is defined by a width profile and its cross slope is defined as the resulting cross slope of intersecting another surface at the offset determined from the width profile.

In some embodiments, still another type of non-planar parametrically defined surface is referred to as a gore sheet, which may typically be used at interchange gore areas. A gore sheet does not have either a Width Profile or a Cross Slope Profile. Its outside edge is defined by another 3D baseline, so any elevation is determined by the straight line from the inside edge directly to the outer 3D baseline (Horizontal Alignment plus Vertical Alignment), the horizontal orientation of this straight line being perpendicular to the horizontal alignment of the controlling PGL Grouping as defined below.

Moreover, in some embodiments, the collection of these types of non-planer parametrically defined surfaces is referred to as a "profile grade line (PGL) grouping". One ribbon in the collection ties directly to the 3D baseline (as a PGL offset), to define the offset of other ribbons relative to the 3D baseline. Other ribbons/ray sheets/hinge sheets/skins in the collection are defined relative to that first ribbon (3D baseline). The PGL offset defines which ribbons are inside or outside ribbons in any given PGL grouping. At any given station, for instance, a ribbon begins at the outside of an inner, adjacent ribbon and proceeds out to its width (as defined by its width profile at the station) at an up angle or down angle as determined by its cross slope (as defined by its cross slope profile at the station). A PGL grouping combines all of the surfaces into a constructible model.

In some embodiments, a PGL grouping can be described as continuous in position, but possibly discontinuous in slope along either the offset vector or the station vector. Examples of a slope discontinuity along the Offset direction (perpendicular to the horizontal alignment) are at the shoulder break point or at the ditch bottom. An example of a discontinuity along the Station direction (parallel to the horizontal alignment) is at the point where the cross slope begins to change in order to develop superelevation (term of art for banking in a curve).

Regardless, in at least some embodiments, the evaluating step in the above-described method comprises determining an elevation of the corridor at a specified station-offset coordinate comprising a specified station along and a specified offset from the 3D baseline, by using said continuous profiles to directly compute the elevation as a function of the specified station-offset coordinate, without translating that coordinate into a Cartesian coordinate.

In one or more embodiments, using said continuous profiles directly to compute the elevation as a function of the specified station-offset coordinate comprises the following: (1) identifying which of said parametrically defined surfaces exists at the specified station-offset coordinate; and (2) computing the elevation of the identified surface at the specified station-offset coordinate. This computing is performed by (A) determining the width and cross-slope of the identified surface at the specified station from the continuous profile of the width of the identified surface and the continuation profile of the cross-slope of the identified surface, respectively; (B) computing a change in elevation across the identified surface at the specified station to the specified offset, as a function of said determined width and cross-slope; and (C) computing the elevation of the identified surface at the specified station-offset coordinate by adding the computed change in elevation to the elevation of an inner edge of the identified surface at the specified station.

In one embodiment, therefore, the system computes an elevation at a station/offset value pair from input data of width and cross slope using parametrically defined values identical to a Profile, except in the case of width, the Profile return value is interpreted as a Width instead of an elevation, and in the case of cross slope the Profile return value is interpreted as a cross slope. From cross slope and width the elevation change from the Grade Point to the point of interest is computed. The elevation change value is added to the Profile elevation to compute the elevation of the surface at the point of interest.

In at least some embodiments, non-planar parametrically defined surfaces are allowed to have multiple return values for any given point. This would be the case of a retaining wall, in which the return value for a point on the face of the wall would be a range from low elevation to high elevation. In the case of a bridge, the PDS would have a top elevation and a bottom elevation for a single station/offset pair.

Regardless, in at least some embodiments, said electronic information comprises at least one of (A) an electronic report that describes one or more characteristics of the corridor; and (B) electronic instructions that indicate to a machine how to construct the corridor or a scaled physical model thereof.

BRIEF DESCRIPTION OF THE DRAWINGS

FIGS. 1 and 2 are block diagrams illustrates ribbons according to one or more embodiments.

FIG. 3 is a block diagram of a collection of ribbons according to one or more embodiments.

FIG. 4 is a block diagram of a ray according to one or more embodiments.

FIG. 5 is a block diagram of a corridor modelling apparatus according to one or more embodiments.

DETAILED DESCRIPTION

According to some embodiments, a proposed roadway model entails a continuous model with tightly integrated types which are designed from initial software specifications forward to be flexible, common sense, easily created, fluently modified, and readily exportable to downstream applications such as hydrologic modeling, machine control for construction, or traffic modeling.

According to some embodiments, the model includes four components: 3D baseline, ribbon, ray sheet, hinge sheet, gore sheet, and conduit.

3D Baseline: A 3D baseline is what the other components are defined relative to. The 3D Baseline is composed of the Horizontal Alignment and the Vertical Alignment, both from the Coordinate Geometry Database. The "length along" a horizontal alignment is used as the independent axis of a coordinate system on the horizontal 2D plane, i.e., Plan View. This value, length along, is termed the Stationing. Every other aspect of the model is coordinated to the Horizontal Alignment by its stationing. To give the alignment a location in three dimensions, the Vertical Alignment is coordinated to the Horizontal Alignment by the station values of the Vertical Alignment control points. The application point of the Vertical Alignment may be coincident with the Horizontal Alignment or it may be applied at an offset.

Ribbon: A ribbon (also referred to as a non-planar parametrically defined surface) is a surface in 3-space defined by its offset from the 3D baseline, its width, and its cross slope. Cross slope is the slope of the ribbon perpendicular to the Inside Edge. Once a Ribbon is established, its outside edge represents a new 3D baseline which may serve as the inside edge for an adjacent Ribbon in order to locate that adjacent Ribbon in space.

A ribbon's width and cross slope may vary along the length of the Alignment. This results in a simple list collection of widths and another list collection of cross slopes for each ribbon to define the class. Both Width and Cross Slope are determinate. FIGS. 1 and 2 illustrate ribbons according to one or more embodiments.

Ribbons form a roadway model by being laid side to side horizontally moving away from the 3D Baseline. The position for ribbon number 2 (counting outwards) is determined by finding the outside position of ribbon 1 and matching it. By continuing this pattern a "horizontal stack" of ribbons is built to form the road model, as shown in FIG. 3. The elevation and slope of the model are thus defined continuously.

Ray Sheet: The discerning reader may notice that the schematic roadway in FIG. 3 does not connect to the existing ground surface. To allow for connecting the model to another entity, the final ribbon is a ribbon that is not defined by cross slope and width, but by cross slope and intersecting element. The intersecting element is usually a Digital Terrain Model (although it may be a Ribbon of another road or a Ray Sheet of another road).

The schematic in FIG. 4 shows a Ray emanating from the outside edge of the outermost Ribbon and continuing on a 4:1 slope until it intersects the existing ground surface (the dashed line). Usually all road models must end with a Ray Sheet as the final component so that the tie-down can be located. (Industry terms for the tie-down are "Construction Limit" and "Slope Stake".)

The next logical step in conceptualizing the model is to extrude the ray along the outside edge of the outermost Ribbon in 3-space. This becomes a Sheet of continuous Rays. Thus the Ray Sheet is an integral part of any Roadway Model. For a Ray Sheet, cross slope is determined by the cross slope profile and width is determined by where the ray intersects the target surface.

Hinge Sheet: A Hinge Line on a single Cross section extends from the outside edge of a Ribbon directly to the point on a target surface at a given offset. The Hinge Line is extruded along the outside edge of the Ribbon resulting in a Sheet of Continuous Hinge Lines to form a Hinge Sheet. The outside edge of the Hinge Sheet is located from the Width Profile and becomes a 2D line in the x-y plane draped along a surface to form a 3D curve. For a Hinge Sheet, width is determined by the width profile and cross slope is determined by where its outside edge drapes vertically onto the target surface.

Gore Sheet: For a Gore Sheet, width is determined by the distance from the inside edge to the horizontal location of the target 3d space curve, which may be another 3D Baseline or it may be the outside edge of a ribbon controlled by a different pgl grouping. This determination is from the inside edge perpendicular in the xy plane to the controlling Horizontal Alignment. Cross Slope is determined by the straight line path from the inside edge of the Gore Sheet to the elevation and offset located on the outside control 3d space curve.

Ray Sheet, Hinge Sheet, and Gore Sheet are all subcategories of Ribbon in which width or cross slope or both width and cross slope are defined by something other than a Profile.

Conduit: The question arises of how to model long solid objects such as Curb and Gutter or Median Barriers. The solution to this is to allow those to be constituted by a sub-grouping of Ribbons that closes on itself. This self-closing group of Ribbons is termed a Conduit.

Ribbons, Ray Sheets, Hinge Sheets, Gore Sheets, and Conduits are to be featurized in some embodiments. Roadway design engineers need features of Lane, Shoulder, Curb and Gutter, Paved Shoulder, Ditch Front Slope, and others. Railway Engineers will need features of Ballast and Rail. Rail, Curb and Gutter, and Median Barriers come in many varieties and widths, and each variety has its own standard name, which may vary by jurisdiction. Therefore, the end users must have the ability to add custom feature types which are features to the end user, but Ribbons, Ray Sheets, Hinge Sheets, Gore Sheets or Conduits to the model.

According to some embodiments of a roadway model, the end user or end support person will have a Typical Section Library (at the agency standardization level) from which they can choose one or more Typical Sections to bring into the project. After extruding one or more Typical Sections from the Library to generate the PGL Groupings and their ribbons, ray sheets, or hinge sheets, the end user may modify their widths, slopes, or number of lanes for their specific needs. Within a project the end user would extrude one or more Typical Sections along one or more 3d Baselines to generate the model. The Typical Section is used by the model engine to extrude Ribbons, Ray Sheets and Conduits along the 3D Baseline, forming the roadway model. After the Typical Section is extruded, the model can be edited for the addition of turn lanes, retaining walls, lateral ditches, ditch grades, or in the case of railway design, frogs and switches.

Other tools and capabilities are derived in some embodiments from the model. These include engineer's tools for setting resurfacing control points and resurfacing grades, bridge clearance control points, intersection design tools, interchange design tools, hydraulic analysis and design tools, and traffic analysis and design tools.

One or more embodiments, from a roadway design process perspective, therefore include the following steps implemented by the corridor modeling system:

(1) Obtaining of Inputs and Constraints.

These include the horizontal alignment of the corridor, the proposed typical section, the existing ground elements (E.g., as a DTM), the proposed profile (vertical alignment), the proposed super elevation, the lane configuration, the bridge and culvert locations, and the like.

Another input includes the 3D baseline. The 3D baseline is generated by associating the existing ground DTM with the horizontal and vertical alignments. This action generates the existing ground profile, which is the existing ground surface cut along the horizontal alignment to result in a profile (collection of lines) which is automatically generated, e.g., by software. This action also generates existing ground cross sections, also automatically generated, e.g., by software.

(2) Generating a Digital Surface Model.

The system, under control of a user (e.g., engineer) associates the typical section to the 3D baseline. This action instantiates a proposed surface model consisting of one or more PGL Groupings and all Ribbons, Ray Sheets, and Hinge Sheets which are subordinate to each PGL Grouping. As part of this action, the system computes the width profile and cross slope profile for each Ribbon, Ray Sheet, and Hinge Sheet as seeded from the Typical Section.

Certain data values resulting from the surface model are not computed by the system until demanded by an end user. These on-demand data values include elevation, cross slope, longitudinal slope, absolute slope, rate of change of slope at any requested point. Additional on-demand computations are drawing a cross section at a given station, and drawing all edges in plan view of all ribbons, ray sheets, and hinge sheets.

(Optional—3) Adjust the Model in Light of Various Design Constraints. Consider the Following Examples:

Process: Change a ribbon's width over a portion of the length of the project.

Example: Because guardrail is being placed from 23+00 to 23+87, the shoulder must be widened from 12' to 17', but only over the range of the guardrail placement. The engineer instructs the system to widen the should at this location. As a result, although no elements outside the shoulder need to be recomputed, when on-demand values for these elements are demanded, these on-demand values will be different due to the modified geometry.

Process: Change a ribbon's cross slope over a portion of the length of the project.

Example: Because of proposed superelevation in the roadway, the roadway ribbons cross slopes are changed from their normal value (2%) to the superelevated value (8%). This change impacts all elements outside of the pavement as a result of the pavement edge elevation being changed by the revised cross slope. Because of the nature of the system, these elements do not need to be recomputed. However any on-demand value may change and it is likely that all on-demand values change going outward.

Process: Change a ray sheet's cross slope over a portion of the length of the project.

Example: A cut slope (modeled as a ray sheet) has a normal cross slope of 2:1. But because other engineers discovered a weaker soil type from station 32+00 to 38+00, the cross slope must be reduced over that range to 3:1. This causes the Construction Limit line, which is a set of on-demand values to be recomputed and thus move farther away from the road over that range.

Process: Change a ray sheet's target surface over a portion of the length of the project.

Example: Over a certain station range, say 10+00 to 100+00, the cut slope (modeled as a ray sheet) extends at 2:1 until it intersects the existing ground (modeled as a Tin file). Subsequent reconnaissance has discovered the presence of underground rock. The underground rock surface only exists from 12+00 to 14+00. Over this range the engineer may use a steeper cut slope because of the higher slope stability of rock. So the ray sheet is adjusted to target the rock Tin file where possible (first in priority) and target the soil Tin file where a rock surface is not found (because the soil surface is second in priority). In this case, an additional ray sheet would be added to tie the slope in to the soil surface. In locations where the rock Tin file is present to be targeted, the ray sheet ends at the intersection with the rock Tin file.

(4) The System Outputs Information from the Model. Consider the Following Examples:

Process: Report on elevation, slope, and slope rate of change for a given Station and offset.

Example: The engineer wishes to determine minimum elevations for a proposed bridge over a different proposed roadway. The engineer would indicate to the system which station/offset pairs to compute elevations for. The system generates these elevation values and returns them to the engineer for further processing in determining the bridge control elevations.

Process: Report on all locations which are susceptible to hydroplaning.

Example: A state DOT design manual declares that roads are susceptible to hydroplaning if the absolute slope is less than 0.2% for a distance of more than 40 feet. In the role of a client checking the design of a consultant for conformity with this guideline, a DOT engineer may request of the system to draw vector graphic shape elements showing everywhere the pavement surface has an absolute slope less than 0.2%, which the system then generates from the model. The DOT engineer would then measure the length of each shape along the traveled path to see if the design of the consultant is in compliance with the DOT guideline.

Process: Generate Construction Limit space curve.

Every proposed corridor project needs to have lines drawn which represent the outer edge of disturbance of earth. Upon request, then the system consults the model and from it generates a continuous 3d spacecurve (a single, sinuous line), which may be plotted in vector-based Cad software, plotted on paper, or indicated (by staking or flagging) on the actual surface of the earth.

Process: Generate a Physical Representation of the model.

Example 1, 3D Printing: An engineer wishes to present a model of the proposed roadway to the client and other stake holders of a project. The system reads the roadway model and generates 3D printing instructions by which a 3D printer can generate a scale model suitable for assembly and presentation to the public. The model is scaled at the scale instructed by the Engineer, and all points on the 3D print are at the same elevation and offset as found in the model. Further, ink or paint may be applied by the 3D printer in different colors to represent different features such as bituminous pavement, turf, or riprap channel lining.

Example 2, Machine Control: After the design phase of the project has been completed and construction of the actual roadway is underway, the model may be electronically transmitted to the computers which control grading equipment. The control software computes the coordinates of the blade from GPS input, it transforms the Latitude and Longitude to the local Cartesian coordinate system, which it then passes to the PDS software, which transforms the Cartesian (XY) coordinates to a Station/Offset pair which it then uses to compute the elevation, slope, and slope rate of change, then returns these values back to the control software, thus becoming in essence 3D printing scored into the surface of the earth at 1:1 scale.

One advantage of at least some embodiments herein is that the corridor modeling system is able to directly determine from the digital surface model the elevation of the corridor at a certain station/offset pair, without having to first convert to Cartesian (x, y) coordinates. Existing systems that rely on triangulated irregular networks for the digital surface model are not able to do this. Indeed, a TIN model can take an x,y coordinate as input to return an elevation or slope. And, a TIN model can determine the elevation of a given station/offset pair, but only if that station/offset value is first converted to an x,y value.

Another advantage of at least some embodiments herein is that the system is configured to determine elevation, slope, and slope rate of change from a station/offset coordinate. That is, the system returns an elevation, slope, or slope rate of change only from a station/offset pair. And if a user seeks to get information of any of those kinds from an x,y coordinate, the user or the algorithm must first convert the station/offset to x,y by applying the station/offset to a transforming algorithm. This transforming algorithm is defined by the parameters of the Horizontal Alignment.

Note that the system herein represents or models the extrusion of the typical section along the 3D baseline in a continuous manner through parametric equations. This contrasts with known approaches that rely on triangulated irregular networks, since those approaches just represent or model the extrusion in a faceted manner through stroking/sampling. That is, the known approaches mostly generate a TIN file by generating break lines and then stroking them, which means computing points at regular intervals along the extruded surface and feeding those points (and their resulting break lines) into an algorithm which then generates the TIN file.

The system herein may be used to model existing surfaces if existing surface points are related to a horizontal alignment and by any method the points or break lines are related to stations and offsets relative to the horizontal alignment and elevations. This type of existing surface model has the advantage that twisting in the surface between surveyed points is modeled in a way that eliminates the ambiguous and inaccurate model of a TIN constituted of planar facets.

Accordingly, the modeling system herein is at the same low level as and in fact replaces a TIN-based modeling system. The modeling system therefore underlies a higher-level user interface, in at least some embodiments. This user interface enables an implementer to more easily present a domain-specific user interface to the end user.

Specifically, ribbons and ray sheets may be featurized. For examples, one ribbon may be featurized as a Through Lane, another ribbon as a Right Turn Lane, another as Sidewalk, and yet another as Class B Riprap. This enables the model to persist the designer's intentions. It also means that the model inherently may be a model of other aspects of the real world, such as traffic flow patterns or hydraulic performance. (Example: Class B Riprap slows water down more than a grass lining. This slowing effect must be accounted for as part of the hydraulic model.)

Further, some aspects inherent to the model are design parameters for roadway design, e.g., taper rate of lane shift, lane addition, or lane drop. The notion of taper rate, for example, maps directly onto the Width Profile's Profile slope. Industry design standards constrain the allowable taper rates. Since the Width Profile's Profile slope correlates directly to lane change taper rates, the end users may control this value directly, which facilitates abiding by the design standards.

In view of the above modifications and variations, those skilled in the art will appreciate that the above described corridor modelling system is implemented in at least some embodiments with one or more processing circuits. One or more embodiments therefore include a corridor modelling apparatus configured to carry out the processing described herein. The apparatus is depicted in FIG. 5.

As shown in FIG. 5, the apparatus comprises a user interface and/or a communication interface 12, as well as one or more processing circuits 14. The obtaining circuit 16 is configured to obtain electronic representations of the existing terrain, a typical cross-section of the corridor, and a 3D baseline. In at least some embodiments, the obtaining circuit 16 obtains these representations via the user interface and/or the communication interface 12. The model generating circuit 18 is configured to generate the digital surface model of the corridor based on the electronic representations obtained by the obtaining circuit 16. And the information generating circuit 20 is configured to generate, based on evaluating the digital surface model, electronic information that facilitates construction of the corridor.

Those skilled in the art will appreciate that the apparatus in FIG. 5 may be implemented as a standalone system or as a network-connected system that communicates with one or more other apparatus to realize the functionality above. In this latter case, the apparatus may not include the user interface shown in the figure. Instead, the apparatus includes a communication interface for communicating with another network-connected apparatus that includes the user interface. In this case, for example, the apparatus functions as a web-based application server that generates the corridor model responsive to user input received via the communication interface.

The circuits discussed above may be implemented (in whole or in part) by one or more dedicated integrated circuits, such as one or more field-programmable gate arrays (FPGAs) or application-specific integrated circuits (ASICs). The circuits may alternatively comprise a processor circuit (consisting of, for example, one or more microprocessors, microcontrollers, digital signal processors, or the like) configured with appropriate software and/or firmware in memory to carry out one or more of the techniques discussed above.

Still other embodiments herein include a computer program product stored on a computer readable medium and comprising program code that, when executed on the apparatus of the above figure, controls the apparatus to realize the above discussed functionality.

Copyrighted program code as used to implement at least some of the embodiments described herein is described below.

A Civil Engineering Ribbon, as discussed above, consists of four components: An inside edge definition (from some other source), a Profile representing the Width at any Station along the Ribbon, a Profile representing the perpendicular Cross Slope at any station, and a direction (Left or Right), indicating whether the outside edge of the ribbon is to the left of the inside edge or is to the right of the inside edge.

```
public class Ribbon
{
    private InsideEdgeDefinition insideEdge;
    private Profile widthProfile;
    private Profile crossSlopeProfile;
    // functions are not shown here, but will be shown later.
}
```

In C#, InsideEdgeDefinition would be an Interface, which could be instantiated as a 3D Baseline (a combination of a Horizontal Alignment and a Vertical Alignment), or it could be instantiated as the Outside Edge of an adjacent Ribbon. In practice, the inside-most Ribbon has an insideEdge instance of a 3D Baseline in order to be mapped to the real world of xyz coordinates.

A ribbon may be instantiated with no insideEdge (insideEdge=null;), but this case may be considered abstract and nominalized with no mapping to the real world. In such a case Offset would equal X (or Y), Station would equal Y (or X), and Elevation would equal Z which would equal 0 at every station.

The Profile Class is Indicated Below:

```
public class Profile
{
    private List<verticalCurveSegment> verticalCurves;
    public double getElevation(Station aStation)
    {
        verticalCurveSegment aVC;
        aVC = findSegmentContainingTheStation(aStation);
        return aVC.getElevation(aStation);
    }
}
```

And the following class represents the vertical curve segment, from which we get the elevation value:

```
private class verticalCurveSegment
{
    private Station BeginStation;
    private double BeginElevation;
    private double BeginSlope;
    private double SlopeRateOfChange;
    public double getElevation(Station aStation)
    {
        double theElevation;
        double lengthIntoVC = aStation – BeginStation;
        double lenSquared = lengthIntoVC * lengthIntoVC;
        theElevation = BeginElevation + (lengthIntoVC * BeginSlope);
        theElevation += slopeRateOfChange * lenSquared / 2;
        return theElevation;
    }
}
```

Note that if the vertical curve segment is a straight line, slopeRateOfChange=0, so the second part of theElevation equation results in zero being added to theElevation.

The equation in verticalCurveSegment.getElevation( ) is a parametric equation. The parameters are aStation, BeginStation, Begin Elevation, BeginSlope, and slopeRateOfChange. This equation only models straight line segments and parabola segments. It is possible to model segments of the other conic sections, circle, ellipse, and hyperbola by adding another private member variable to the verticalCurveSegment class, eccentricity. This is not common practice in the industry, so the adjustments to the parametric equations are not shown.

A common operation on a Ribbon is to ask for an elevation on the ribbon at a given Station/Offset. This operation would be implemented as a function of the class, also commonly called a method of the class. Here is the source code for the getElevation method of class Ribbon:

```
public class Ribbon
{
  // member variables are shown above.
    public double getElevation(Station aStationValue, double Offset)
    {
      double elevChange; // change in elevation from inside edge
            // to Offset
      double width ForComputation;
      double ribbonWidth;
      ribbonWidth = widthProfile.getElevation(aStationValue);
      if (Offset > ribbonWidth)
         widthForComputation = ribbonWidth;
      else
         widthForComputation = Offset;
      double crossSlope = crossSlopeProfile.getElevation(aStationValue);
      elevChange = crossSlope * widthForComputation;
      double actualElevation;
      actualElevation = insideEdge.getOutermostElevation(aStationValue)
            + elevChange;
      return actualElevation;
    }
}
```

With this understanding, note that a PGL Grouping is a Grouping of Ribbons associated with a single Profile Grade Line. The Profile Grade Line is similar to the 3D Baseline, but it has a subtle difference in that it does not have to be collocated with the 3D Baseline. It's offset and elevation drop from the 3D Baseline as determined by a Ribbon, Ray Sheet, Hinge Sheet, or Sheet (see those terms defined under Question 1). That is, the offset from the 3D Baseline to the Profile Grade Line is a Ribbon, and Ray Sheet, Hinge Sheet, and Sheet are special kinds of Ribbons.

Class PGL Grouping Appears Below:

```
public class PGLgrouping
{
  private Ribbon thePGLoffsetRibbon;
  private List<Ribbon> allOutsideRibbons;
  private List<Ribbon> allInsideRibbons;
  private Profile elevation Profile;
  // other code not listed here will take care of adding Ribbons
  // or changing their parameters
  public double getElevation(Station aStation, double Offset)
  {
    double offsetWorkingValue =
         thePGLoffsetRibbon.getWidth(aStation) - Offset;
    double cumulativeElevationDrop = 0.0;
    List<Ribbon> workingRibbons;
    if (offsetWorkingValue >= 0.0)
       workingRibbons = allOutsideRibbons;
    else
       workingRibbons = allInsideRibbons;
    foreach (ribbon in working Ribbons)
    {
       cumulativeElevationDrop +=
          ribbon.getElevation(aStation, out offsetWorkingValue);
       if (offsetWorkingValue == 0.0)
         break;
    }
    return elevationProfile + cummulativeElevationDrop;
  }
}
```

Explanation of "out offsetWorkingValue": The "out" keyword in C# allows offsetWorkingValue to be modified by the function getElevation. In this case, if the first Ribbon is 12' wide, and offsetWorkingValue is 14', then after the getElevation method returns an elevation drop, offsetWorkingValue has also been modified. Now offsetWorkingValue is 2' because this 12-foot ribbon used up that much of offset. So when it goes to the next Ribbon, which let's say is also 12', it returns the elevation drop only 2 feet into the ribbon, and sets the value of offsetWorkingValue to 0.0, causing the for each loop to exit the loop.

This is why Ribbon.getElevation returns an elevation value when it receives an offset greater than the width of the ribbon. Similarly, it return null or "no value" if the offset is off of the entire model.

So Ray Sheets, Hinge Sheets, and Gore Sheets are special kinds of Ribbons, whereas Through Lane, Curb and Gutter, or V-Ditches are features that can be attributed to any kind of ribbon.

Finally, Ribbons may contain child ribbons. This would happen in a situation where part of the shoulder is asphalt and part is turf, but the whole thing together is the shoulder.

Cross Section.

A drawing in the road in cross section view. Cross sections show the existing ground (the dashed line in FIG. 4, above), and the proposed roadway surface. The grade point of the roadway is drawn at the elevation as specified by the Profile. The roadway lanes, shoulders, and side slopes are then drawn in accordance with the typical sections, but with exceptions as determined by the engineer. For example, Superelevation may require that the roadway surface cross slope be drawn at some value other than the "normal" value, or the addition of a turn lane may make the drawing of the pavement wider at some stations.

Cross Slope.

Cross Slope is the angle up or down on a surface from a given point on the surface at a direction perpendicular to the controlling Horizontal Alignment. Cross Slope may be represented as up angle in degrees, or as slope percentage, as slope rise:run, or as run:rise.

Examples are 9.4623° (up angle), +16.67% (slope percentage), or 6:1. All of these are examples of the same slope.

When a Profile is used to represent Cross Slope, the value being returned from the Profile must have an interpretation applied to it as one of these kinds. This is because the curvature of the twisting is determined by how the change of slope values are interpreted.

In the roadway construction industry, the interpretation is usually a hybrid of these depending on the slope:

a. From 0% to 10.0% use slope percentage.
b. From 10:1 to 0.5:1 use run:rise.

In the slope percentage interpretation of slope value, vertical surface slopes (walls) have value of infinity and thus can not be represented in a cross slope profile. In this case one of the other interpretations must be applied, in which a hybrid interpretation is possible.

Cut and Fill.

Cut and Fill are shorthand terms to describe how the proposed surface relates to the existing terrain surface. If a road will have embankment placed on top of the earth in order to raise the elevation, the road at that point is said to be "in Fill". Similarly, if the road will have earth excavated (dug out) at a given point in order to lower the elevation of the earth, that point is said to be "in Cut".

Construction Limits (also called "Slope Stakes"), are the outside edge of the disturbance of earth. If the disturbance consists of excavating the existing ground, the Construction Limit is called "a Cut Construction Limit". If the disturbance is placing new earth on top of the existing earth, it is termed "a Fill Construction Limit."

DTM: Digital Terrain Model

A DTM represents an existing surface by correlating an x and y value to a z value. For any given point (x,y), report the elevation on the surface at this point (z). DTM's are conventionally represented by Triangulated Irregular Networks, which approximate a surface (existing or proposed) by interpolating within the limits of a triangle formed by three known points. Multiple surfaces may be represented by multiple DTM's. For example, a large DTM can represent the surface of the earth in a given area, while the top surface of a bridge would be represented by a different DTM.

Grade Point.

The location on the Typical Section where the controlling elevation is to be applied. The elevation of the Grade Point comes from the proposed Profile.

Horizontal Alignment (Also Referred to as Chain or Centerline or Survey Line).

Mathematically, a Horizontal Alignment is a curve in the X-Y plane, consisting of line segments, arcs (portions of circles), and Euler Spirals. These various elements all have parametric definitions (relating length-along the element to the x-y location of the element). These elements, line segments, arcs, and Euler Spirals, are arranged end-to-end to form a continuous Horizontal Alignment.

A Horizontal Alignment serves as a curvilinear coordinate system. The length-along the element is referred to as the Station. If a point of interest is located off of the Horizontal Alignment, it is referred to by the Station plus the Offset, in which Offset is the perpendicular distance from the Horizontal Alignment to the point of interest. Thus x-y coordinates may be converted to station/offset coordinates as needed, or the reverse process can convert from station/offset to x-y coordinates.

Profile.

The corridor Profile is comparable to the Elevation view of an architecture drawing in that it is a view of the proposed roadway looking at it from the right side.

The Profile is the elevation of the existing ground or the proposed grade point. The existing ground profile is a list of y values correlated to x values. These are linked to form the outline of the top of ground along the Horizontal Alignment.

The Profile of the proposed roadway is a linking of line segments, and segments of parabolas (or other conic sections), all of which are defined parametrically along the length of the roadway. The lines and parabolas are usually continuous in elevation and slope. For any given x value, the y value is read from the profile (in which the x value correlates to Station and serves to map the Profile to a Horizontal Alignment). Conventionally this y value is understood to be the proposed elevation of the roadway at the Grade Point.

It should be noted that any value which may vary along the length of the corridor may be represented on a Profile since a Profile is nothing more than an x-y graph. The y value may be interpreted as anything the engineer desires, including elevation, cross slope, roadway width, earthwork areas, Average Daily Traffic volumes, or water flow volume (for streams). Profiles in which the y value is interpreted as something other than elevation are sometimes termed "Relative Profiles" in the industry.

Normal Crown.

The cross slope configuration of the pavement surface in "normal" situations, i.e., when there is no curving roadway.

Station.

A value indicating the position of a point along a Horizontal Alignment

Superelevation.

The banking of the roadway when it is in a curve. Superelevation is used to aid vehicles in resisting centrifugal force as they go around the curve at highway speeds. Railways superelevate by raising the elevation of the outer rail relative to the inner rail.

For roadways, when the road is superelevated, this also effects the cross slope of and elevation of the shoulder. The normal ditch elevation is also affected by superelevation in that it follows the shoulder break point at a specific width and cross slope.

Surface.

For the sake of this document, a Surface is an infinitesimally thin boundary between volumes of different material composition. In most cases the surface being modeled (or targeted for resolution by Ray Sheets and Hinge Sheets) is the boundary between earth and air. However a surface may be the boundary between other types of volumes, including a volume of rock and a volume of soil.

Further, this model is able to represent the proposed surface of the boundary between graded earthwork and pavement courses. This surface is termed in the industry as the "Grade Line". In some embodiments, the outside edge of the proposed Grade Line is determined via a Ray Sheet resolving to the cut slope or fill slope of the roadway surface.

Other types of surfaces which can be modeled include the boundaries between different kinds of pavement courses, or the intermediate surfaces of partially constructed roadways for the purpose of phasing traffic during project construction.

Typical Section.

A line drawing of the proposed corridor in a cross-sectional (front) view showing typical features: number of lanes, shoulder or curbing, side slopes in excavation conditions or embankment conditions, and how each relate to each other. For each of these, cross slopes or cross slope ranges are given, and widths or width ranges are given. A typical section also always shows the location of the Grade Point, which is the vertical control. All of these items are related by dimensioning offset values to a Horizontal Alignment.

Width.

In this document width is understood to mean horizontal width (such as constitutes the base of a right triangle). Other interpretations of width may be used. Width-along-slope would be the length along the hypotenuse of a right triangle. This interpretation is not generally used in roadway related fields.

When using this PDS model to represent a retaining wall or other vertical or nearly vertical surface (such as the side of a culvert or bridge), the width Profile may be interpreted as height.

What is claimed is:

1. A method performed by a corridor modeling system implemented with one or more processing circuits for modeling a corridor to be constructed along an existing terrain, the method comprising:
    obtaining at the system an electronic representation of the existing terrain;
    obtaining at the system an electronic representation of a typical cross-section of the corridor;
    obtaining at the system an electronic representation of a 3D baseline of the corridor that aligns the typical cross-section relative to the existing terrain; and
    generating at the system a digital surface model of the corridor based on the electronic representations, by extruding the typical cross-section along the 3D baseline and fundamentally modeling continuous surfaces of the corridor resulting from the extrusion as a collection of non-planar parametrically defined surfaces, rather than as a group of discrete facets formed from a triangulated irregular network.

2. The method of claim 1, further comprising generating, based on evaluating the digital surface model, electronic information that facilitates construction of the corridor.

3. The method of claim 2, wherein said electronic information comprises at least one of:

an electronic report that describes one or more characteristics of the corridor; and electronic instructions that indicate to a machine how to construct the corridor or a scaled physical model thereof.

4. The method of claim 1, wherein said collection includes a surface defined parametrically with a continuous profile of a variable width of the surface and a continuous profile of a variable cross-slope of the surface, wherein a continuous profile of a variable width describes the variation of the surface's width along the 3D baseline, and wherein a continuous profile of a variable cross-slope describes the variation of the surface's cross-slope along the 3D baseline.

5. The method of claim 1, wherein said collection includes a ribbon, wherein a ribbon is a surface defined by emanating from a given elevation at a given direction determined from the normal of a Horizontal Alignment at a determinant cross slope which is stored in a Cross Slope Profile and extends for a determinant total width which is stored in a Width Profile.

6. The method of claim 1, wherein said collection comprises a profile grade line (PGL) grouping, wherein the PGL grouping comprises:
one ribbon that ties directly to the 3D baseline; and
other surfaces defined relative to said ribbon.

7. The method of claim 1, wherein said collection includes a surface defined parametrically with a continuous profile of a variable cross-slope of the surface and with the intersection of the surface with another surface.

8. The method of claim 1, wherein said collection includes a ray sheet, wherein a ray sheet is constituted by a continuous extrusion of rays in which the start point for each ray is extruded along a three dimensional reference curve and the ray at each point extends perpendicularly from the three dimensional reference curve in a horizontal direction, and at a specific cross slope to determine change of elevation, and wherein the ray sheet extends for a total width determined by intersection with another surface.

9. The method of claim 8, wherein a ray sheet is defined to intersect another surface in accordance with a prioritized list of potentially intersecting surfaces.

10. The method of claim 1, wherein said collection includes a hinge sheet, wherein a hinge sheet has a width defined by a width profile and a cross slope defined as the resulting cross slope of intersecting another surface at the offset determined from the width profile.

11. The method of claim 1, further comprising evaluating the digital surface model, wherein said evaluating comprises determining an elevation of the corridor at a specified station-offset coordinate comprising a specified station along and a specified offset from the 3D baseline, by using said continuous profiles to directly compute the elevation as a function of the specified station-offset coordinate, without translating that coordinate into a Cartesian coordinate.

12. The method of claim 11, wherein said using comprises:
identifying which of said parametrically defined surfaces exists at the specified station-offset coordinate; and
computing the elevation of the identified surface at the specified station-offset coordinate.

13. The method of claim 12, wherein said computing comprises:
determining the width and cross-slope of the identified surface at the specified station from the continuous profile of the width of the identified surface and the continuation profile of the cross-slope of the identified surface, respectively;
computing a change in elevation across the identified surface at the specified station to the specified offset, as a function of said determined width and cross-slope; and
computing the elevation of the identified surface at the specified station-offset coordinate by adding the computed change in elevation to the elevation of an inner edge of the identified surface at the specified station.

14. The method of claim 12, wherein said computing comprises computing the elevation from input data of width and cross slope using parametrically defined values identical to a Profile, except in the case of width, the Profile return value is interpreted as a Width instead of an elevation, and in the case of cross slope the Profile return value is interpreted as a cross slope.

15. A corridor modelling apparatus configured to model a corridor to be constructed along an existing terrain, the apparatus comprising:
at least one of a user interface and a communication interface;
one or more processing circuits configured to:
obtain an electronic representation of the existing terrain;
obtain an electronic representation of a typical cross-section of the corridor;
obtain an electronic representation of a 3D baseline of the corridor that aligns the typical cross-section relative to the existing terrain; and
generate a digital surface model of the corridor based on the electronic representations, by extruding the typical cross-section along the 3D baseline and fundamentally modeling continuous surfaces of the corridor resulting from the extrusion as a collection of non-planar parametrically defined surfaces, rather than as a group of discrete facets formed from a triangulated irregular network.

16. The apparatus of claim 15, wherein the one or more processing circuits are further configured to generate, based on evaluating the digital surface model, electronic information that facilitates construction of the corridor.

17. The apparatus of claim 15, wherein said collection includes a surface defined parametrically with a continuous profile of a variable width of the surface and a continuous profile of a variable cross-slope of the surface, wherein a continuous profile of a variable width describes the variation of the surface's width along the 3D baseline, and wherein a continuous profile of a variable cross-slope describes the variation of the surface's cross-slope along the 3D baseline.

18. The apparatus of claim 15, wherein said collection includes a ribbon, wherein a ribbon is a surface defined by emanating from a given elevation at a given direction determined from the normal of a Horizontal Alignment at a determinant cross slope which is stored in a Cross Slope Profile and extends for a determinant total width which is stored in a Width Profile.

19. The apparatus of claim 15, wherein the one or more processing circuits are further configured to evaluate the digital surface model, wherein said evaluating comprises determining an elevation of the corridor at a specified station-offset coordinate comprising a specified station along and a specified offset from the 3D baseline, by using said continuous profiles to directly compute the elevation as a function of the specified station-offset coordinate, without translating that coordinate into a Cartesian coordinate.

20. The apparatus of claim 19, wherein the one or more processing circuits are configured to:

identify which of said parametrically defined surfaces exists at the specified station-offset coordinate; and compute the elevation of the identified surface at the specified station-offset coordinate, by:

determining the width and cross-slope of the identified surface at the specified station from the continuous profile of the width of the identified surface and the continuation profile of the cross-slope of the identified surface, respectively;

computing a change in elevation across the identified surface at the specified station to the specified offset, as a function of said determined width and cross-slope; and computing the elevation of the identified surface at the specified station-offset coordinate by adding the computed change in elevation to the elevation of an inner edge of the identified surface at the specified station.

21. A computer program product stored on a non-transitory computer readable medium and comprising program code that, when executed by one or more processing circuits of a corridor modeling system, causes the corridor modeling system to model a corridor to be constructed along an existing terrain by:

obtaining at the system an electronic representation of the existing terrain;

obtaining at the system an electronic representation of a typical cross-section of the corridor;

obtaining at the system an electronic representation of a 3D baseline of the corridor that aligns the typical cross-section relative to the existing terrain; and generating at the system a digital surface model of the corridor based on the electronic representations, by extruding the typical cross-section along the 3D baseline and fundamentally modeling continuous surfaces of the corridor resulting from the extrusion as a collection of non-planar parametrically defined surfaces, rather than as a group of discrete facets formed from a triangulated irregular network.

22. The computer program product of claim 21, wherein the program code, when executed by one or more processing circuits of a corridor modeling system, causes the corridor modeling system to generate, based on evaluating the digital surface model, electronic information that facilitates construction of the corridor.

23. The computer program product of claim 22, wherein said electronic information comprises at least one of:

an electronic report that describes one or more characteristics of the corridor; and electronic instructions that indicate to a machine how to construct the corridor or a scaled physical model thereof.

24. The computer program product of claim 21, wherein said collection includes a surface defined parametrically with a continuous profile of a variable width of the surface and a continuous profile of a variable cross-slope of the surface, wherein a continuous profile of a variable width describes the variation of the surface's width along the 3D baseline, and wherein a continuous profile of a variable cross-slope describes the variation of the surface's cross-slope along the 3D baseline.

25. The computer program product of claim 21, wherein said collection includes a ribbon, wherein a ribbon is a surface defined by emanating from a given elevation at a given direction determined from the normal of a Horizontal Alignment at a determinant cross slope which is stored in a Cross Slope Profile and extends for a determinant total width which is stored in a Width Profile.

26. The computer program product of claim 21, wherein said collection comprises a profile grade line (PGL) grouping, wherein the PGL grouping comprises:

one ribbon that ties directly to the 3D baseline; and
other surfaces defined relative to said ribbon.

27. The computer program product of claim 21, wherein said collection includes a surface defined parametrically with a continuous profile of a variable cross-slope of the surface and with the intersection of the surface with another surface.

28. The computer program product of claim 21, wherein said collection includes a ray sheet, wherein a ray sheet is constituted by a continuous extrusion of rays in which the start point for each ray is extruded along a three dimensional reference curve and the ray at each point extends perpendicularly from the three dimensional reference curve in a horizontal direction, and at a specific cross slope to determine change of elevation, and wherein the ray sheet extends for a total width determined by intersection with another surface.

29. The computer program product of claim 28, wherein a ray sheet is defined to intersect another surface in accordance with a prioritized list of potentially intersecting surfaces.

30. The computer program product of claim 21, wherein said collection includes a hinge sheet, wherein a hinge sheet has a width defined by a width profile and a cross slope defined as the resulting cross slope of intersecting another surface at the offset determined from the width profile.

31. The computer program product of claim 21, wherein the program code, when executed by one or more processing circuits of a corridor modeling system, causes the corridor modeling system to evaluate the digital surface model, wherein said evaluating comprises determining an elevation of the corridor at a specified station-offset coordinate comprising a specified station along and a specified offset from the 3D baseline, by using said continuous profiles to directly compute the elevation as a function of the specified station-offset coordinate, without translating that coordinate into a Cartesian coordinate.

32. The computer program product of claim 31, wherein said using comprises:

identifying which of said parametrically defined surfaces exists at the specified station-offset coordinate; and
computing the elevation of the identified surface at the specified station-offset coordinate.

33. The computer program product of claim 32, wherein said computing comprises:

determining the width and cross-slope of the identified surface at the specified station from the continuous profile of the width of the identified surface and the continuation profile of the cross-slope of the identified surface, respectively;

computing a change in elevation across the identified surface at the specified station to the specified offset, as a function of said determined width and cross-slope; and computing the elevation of the identified surface at the specified station-offset coordinate by adding the computed change in elevation to the elevation of an inner edge of the identified surface at the specified station.

34. The computer program product of claim 32, wherein said computing comprises computing the elevation from input data of width and cross slope using parametrically defined values identical to a Profile, except in the case of width, the Profile return value is interpreted as a Width instead of an elevation, and in the case of cross slope the Profile return value is interpreted as a cross slope.

\* \* \* \* \*